United States Patent
Franch et al.

(10) Patent No.: US 9,568,548 B1
(45) Date of Patent: Feb. 14, 2017

(54) MEASUREMENT OF SIGNAL DELAYS IN MICROPROCESSOR INTEGRATED CIRCUITS WITH SUB-PICOSECOND ACCURACY USING FREQUENCY STEPPING

(71) Applicant: INTERNATIONAL BUSINESS MACHINES CORPORATION, Armonk, NY (US)

(72) Inventors: Robert L. Franch, Wappingers Falls, NY (US); Phillip J. Restle, Katonah, NY (US); David Wen-Hao Shan, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/882,668

(22) Filed: Oct. 14, 2015

(51) Int. Cl.
*G01R 31/317* (2006.01)
*G01R 31/28* (2006.01)

(52) U.S. Cl.
CPC ..... *G01R 31/31725* (2013.01); *G01R 31/2882* (2013.01)

(58) Field of Classification Search
CPC .................... G01R 31/2882; G01R 31/31725; G01R 31/31726
See application file for complete search history.

(56) References Cited

U.S. PATENT DOCUMENTS

| | | |
|---|---|---|
| 4,703,448 A | 10/1987 | Muething et al. |
| 5,559,478 A | 9/1996 | Athas et al. |
| 5,870,404 A | 2/1999 | Ferraiolo et al. |
| 5,889,435 A | 3/1999 | Smith et al. |
| 6,185,509 B1 | 2/2001 | Wilstrup et al. |
| 6,185,706 B1 | 2/2001 | Sugasawara |
| 6,208,169 B1 | 3/2001 | Wong et al. |
| 6,295,315 B1 | 9/2001 | Frisch et al. |
| 6,366,631 B1 | 4/2002 | Nakayama et al. |
| 6,522,122 B2 | 2/2003 | Watanabe et al. |
| 6,535,735 B2 | 3/2003 | Underbrink et al. |
| 6,640,103 B1 | 10/2003 | Inman et al. |
| 6,661,836 B1 | 12/2003 | Dalal et al. |

(Continued)

OTHER PUBLICATIONS

U.S. Appl. No. 14/303,671, filed Jun. 13, 2014, Bansal, et al.

(Continued)

*Primary Examiner* — Patrick O'Neill
(74) *Attorney, Agent, or Firm* — Mitch Harris, Atty at Law, LLC; Andrew M. Harris; Steven L. Bennett

(57) ABSTRACT

A delay measurement technique using a tapped delay line edge capture circuit that captures tap position of edges within the delay line provides accuracy of measurement to one pico-second and below. A control circuit causes latches to capture an edge of a signal delayed through the delay line at taps of the delay line. The frequency of a clock from which the signal is derived is adjusted and tap outputs are captured by latches and averaged. A first frequency is found at which the average edge position is midway between two adjacent tap positions. A second signal, which may be the reference signal that clocks the latches, is propagated through the delay line and a second frequency is found for which the average edge position lies at the boundary between the two tap positions. The delay is determined from the difference between the periods of the first frequency and the second frequency.

13 Claims, 10 Drawing Sheets

(56) References Cited

U.S. PATENT DOCUMENTS

| | | | |
|---|---|---|---|
| 6,728,311 B1 | 4/2004 | Waschura et al. | |
| 6,785,622 B2 | 8/2004 | Nygaard, Jr. | |
| 6,836,738 B2 | 12/2004 | Sepp et al. | |
| 6,841,985 B1 | 1/2005 | Fetzer | |
| 6,871,152 B2 | 3/2005 | Nygaard, Jr. | |
| 6,924,679 B2 | 8/2005 | Seno et al. | |
| 6,934,648 B2 | 8/2005 | Hanai et al. | |
| 6,958,659 B2 | 10/2005 | Nakajima | |
| 6,983,394 B1* | 1/2006 | Morrison | G01R 31/31708 713/500 |
| 6,995,621 B1 | 2/2006 | Culler | |
| 7,015,765 B2 | 3/2006 | Shepard et al. | |
| 7,071,736 B2 | 7/2006 | Wilkstrom | |
| 7,107,558 B2 | 9/2006 | Tetelbaum et al. | |
| 7,145,408 B2 | 12/2006 | Shepard et al. | |
| 7,158,899 B2 | 1/2007 | Sunter et al. | |
| 7,184,470 B2 | 2/2007 | Whitlock | |
| 7,190,233 B2 | 3/2007 | Bhushan et al. | |
| 7,203,610 B2 | 4/2007 | Tabatabaei et al. | |
| 7,206,343 B2 | 4/2007 | Pearce | |
| 7,237,217 B2 | 6/2007 | Restle | |
| 7,265,590 B2 | 9/2007 | Seki et al. | |
| 7,286,947 B1 | 10/2007 | Cranford, Jr. et al. | |
| 7,389,192 B2 | 6/2008 | Cranford, Jr. et al. | |
| 7,400,555 B2 | 7/2008 | Franch et al. | |
| 7,411,436 B2 | 8/2008 | Fang et al. | |
| 7,441,164 B2 | 10/2008 | Guettaf | |
| 7,571,410 B2 | 8/2009 | Restle | |
| 7,576,569 B2 | 8/2009 | Carpenter et al. | |
| 7,719,316 B2 | 5/2010 | Chueh et al. | |
| 7,719,317 B2 | 5/2010 | Chueh et al. | |
| 7,742,388 B2 | 6/2010 | Shearer et al. | |
| 7,810,000 B2 | 10/2010 | Ngo et al. | |
| 7,872,539 B1 | 1/2011 | Athas | |
| 7,880,551 B2 | 2/2011 | Chan et al. | |
| 7,930,120 B2 | 4/2011 | Cranford, Jr. et al. | |
| 7,944,229 B2* | 5/2011 | Joshi | G01R 31/31726 324/750.3 |
| 7,956,664 B2 | 6/2011 | Chueh et al. | |
| 7,961,559 B2 | 6/2011 | Dixon et al. | |
| 8,289,063 B2 | 10/2012 | Chueh et al. | |
| 8,339,209 B2 | 12/2012 | Papaefthymiou et al. | |
| 8,358,163 B2 | 1/2013 | Papaefthymiou et al. | |
| 8,362,811 B2 | 1/2013 | Papaefthymiou et al. | |
| 8,368,450 B2 | 2/2013 | Papaefthymiou et al. | |
| 8,400,192 B2 | 3/2013 | Papaefthymiou et al. | |
| 8,405,413 B2 | 3/2013 | Carpenter et al. | |
| 8,461,873 B2 | 6/2013 | Ishii et al. | |
| 8,466,739 B2 | 6/2013 | Kim et al. | |
| 8,502,569 B2 | 8/2013 | Papaefthymiou et al. | |
| 8,576,000 B2 | 11/2013 | Kim et al. | |
| 8,593,183 B2 | 11/2013 | Papaefthymiou et al. | |
| 8,611,379 B2 | 12/2013 | Raghavan et al. | |
| 8,659,338 B2 | 2/2014 | Papaefthymiou et al. | |
| 8,704,576 B1 | 4/2014 | Bucelot et al. | |
| 8,729,975 B2 | 5/2014 | Van Goor et al. | |
| 8,736,342 B1 | 5/2014 | Bucelot et al. | |
| 8,847,652 B2 | 9/2014 | Chern et al. | |
| 8,854,100 B2 | 10/2014 | Sathe et al. | |
| 9,054,682 B2 | 6/2015 | Bucelot et al. | |
| 9,058,130 B2 | 6/2015 | Bucelot et al. | |
| 9,116,204 B2* | 8/2015 | O'Mahony | G01R 31/31726 |
| 2002/0057126 A1 | 5/2002 | Hsu et al. | |
| 2002/0103609 A1 | 8/2002 | Kuyel | |
| 2002/0112213 A1 | 8/2002 | Abadir et al. | |
| 2002/0130699 A1 | 9/2002 | Zimlich | |
| 2002/0135343 A1 | 9/2002 | Underbrink et al. | |
| 2003/0108137 A1 | 6/2003 | Li et al. | |
| 2003/0189451 A1 | 10/2003 | Ziesler et al. | |
| 2003/0191977 A1 | 10/2003 | Ziesler et al. | |
| 2003/0201803 A1 | 10/2003 | Kim et al. | |
| 2004/0130372 A1 | 7/2004 | Seki et al. | |
| 2004/0143406 A1 | 7/2004 | Nishikobara et al. | |
| 2005/0022145 A1 | 1/2005 | Tetelbaum et al. | |
| 2005/0036578 A1 | 2/2005 | Heidel et al. | |
| 2005/0069031 A1 | 3/2005 | Sunter et al. | |
| 2005/0111536 A1 | 5/2005 | Cranford, Jr. et al. | |
| 2005/0177758 A1 | 8/2005 | Stickle et al. | |
| 2005/0286627 A1 | 12/2005 | Tabatabaei | |
| 2006/0023778 A1 | 2/2006 | Bergmann et al. | |
| 2006/0069967 A1 | 3/2006 | Almy et al. | |
| 2006/0082387 A1 | 4/2006 | Papaefthymiou et al. | |
| 2006/0171223 A1 | 8/2006 | Kim | |
| 2006/0251200 A1 | 11/2006 | Miller | |
| 2007/0096957 A1 | 5/2007 | Papaefthymiou et al. | |
| 2008/0150605 A1 | 6/2008 | Chueh et al. | |
| 2008/0303552 A1 | 12/2008 | Chueh et al. | |
| 2008/0303576 A1 | 12/2008 | Chueh et al. | |
| 2009/0027085 A1 | 1/2009 | Ishii et al. | |
| 2011/0084736 A1 | 4/2011 | Papaefthymiou et al. | |
| 2011/0084772 A1 | 4/2011 | Papaefthymiou et al. | |
| 2011/0084773 A1 | 4/2011 | Papaefthymiou et al. | |
| 2011/0084774 A1 | 4/2011 | Papaefthymiou et al. | |
| 2011/0084775 A1 | 4/2011 | Papaefthymiou et al. | |
| 2011/0090018 A1 | 4/2011 | Papaefthymiou et al. | |
| 2011/0090019 A1 | 4/2011 | Papaefthymiou et al. | |
| 2011/0095802 A1 | 4/2011 | Horikoshi et al. | |
| 2011/0140753 A1 | 6/2011 | Papaefthymiou et al. | |
| 2011/0210761 A1 | 9/2011 | Ishii et al. | |
| 2011/0215854 A1 | 9/2011 | Chueh et al. | |
| 2011/0216604 A1 | 9/2011 | Mikajiri et al. | |
| 2011/0260781 A1 | 10/2011 | Takeuchi et al. | |
| 2012/0044958 A1 | 2/2012 | Raghavan et al. | |
| 2013/0194018 A1 | 8/2013 | Papaefthymiou et al. | |
| 2013/0328608 A1 | 12/2013 | Papaefthymiou et al. | |
| 2014/0002175 A1 | 1/2014 | Papaefthymiou et al. | |
| 2014/0002204 A1 | 1/2014 | Kim et al. | |
| 2014/0015585 A1 | 1/2014 | Papaefthymiou et al. | |
| 2014/0028407 A1 | 1/2014 | Chern et al. | |
| 2014/0035649 A1 | 2/2014 | Nedovic | |
| 2014/0062562 A1 | 3/2014 | Sathe et al. | |
| 2014/0062565 A1 | 3/2014 | Sathe et al. | |
| 2014/0062566 A1 | 3/2014 | Sathe et al. | |
| 2014/0079169 A1 | 3/2014 | Raghavan et al. | |
| 2014/0167832 A1 | 6/2014 | Bucelot et al. | |
| 2014/0167868 A1 | 6/2014 | Guthaus | |
| 2014/0240021 A1 | 8/2014 | Hibbeler et al. | |
| 2014/0317389 A1 | 10/2014 | Wenisch et al. | |
| 2015/0002204 A1 | 1/2015 | Aipperspach et al. | |

OTHER PUBLICATIONS

U.S. Appl. No. 14/820,726, filed Aug. 7, 2015, Bucelot et al.

U.S. Appl. No. 14/814,780, filed Jul. 31, 2015, Bucelot et al.

Jain, et al., "On-Chip Delay Measurement Circuit", 2012 17th IEEE European Test Symposium, May 28-31, 2012, 6 pages (pp. 1-6 in pdf), IEEE Computer Society, Annecy, France.

Chan, et al., "Design of Resonant Global Clock Distributions" Proceedings of the 21st International Conference on Computer Design, ICCD '03, Oct. 13-15, 2003, 6 pages(pp. 1-6 in pdf), IEEE Computer Society, San Jose, CA, US.

Chan, et al., "A 4.6GHz Resonant Global Clock Distribution Network", 2004 IEEE International Solid-State Circuits Conference, Feb. 18, 2004, 8 pages (pp. 1-8 in pdf), IEEE, San Francisco, CA, US.

Chan, et al., "Uniform-Phase Uniform-Amplitude Resonant-Load Global Clock Distributions", IEEE Journal of Solid-State Circuits, Jan. 2005, pp. 102-109, vol. 40, No. 1, IEEE, US.

Sathe, et al., Resonant-Clock Latch-Based Design, IEEE Journal of Solid-State Circuits, Apr. 2008, pp. 864-873, vol. 43, No. 4, IEEE, US.

Chan, et al., "A Resonant Global Clock Distribution for the Cell Broadband Engine Processor", IEEE Journal of Solid-State Circuits, Jan. 2009, pp. 64-72, vol. 44, No. 1, IEEE, US.

Sathe, et al., "Resonant-Clock Design for a Power-Efficient, High-vol. x86-64 Microprocessor", IEEE Journal of Solid-State Circuits, Jan. 2013, pp. 140-149, vol. 48, No. 1, IEEE, US.

Restle, et al., "Wide-Frequency-Range Resonant Clock with On-the-Fly Mode Changing for the POWER8 Microprocessor", 2014 IEEE International Solid-State Circuits Conference, Feb. 10, 2014, 3 pages (pp. 1-3 in pdf), IEEE, San Francisco, CA, US.

(56) References Cited

OTHER PUBLICATIONS

U.S. Appl. No. 14/828,841, filed Aug. 18, 2015, Bucelot, et al.
U.S. Appl. No. 14/828,898, filed Aug. 18, 2015, Bucelot, et al.
Chan, et al., "A Resonant Global Clock Distribution for the Cell Broadband-Engine Processor", 2008 IEEE International Solid-State Circuits Conference, Session 28, Feb. 6, 2008, 3 pp. (pp. 1-3 in pdf), IEEE, San Francisco, CA, US.
Franch, et al., "On-chip timing uncertainty measurements on IBM microprocessors", IEEE International Test Conference, Oct. 2007, paper 1.1, pp. 1-7, Santa Clara, CA, US.
Amrutur, et al., "0.84 ps. Resolution Clock Skew Measurement via Subsampling", IEEE Transactions on Very Large Scale Integration (VLSI) Systems, Dec. 2011, pp. 2297-2275, vol. 19, No. 12, IEEE, US.
Elgebaly, et al., "Efficient Adaptive Voltage Scaling System Through On-Chip Critical Path Emulation", Proceedings of the 2004 International Symposium on Low Power Electronics and Design, ISLPED '04, Aug. 11, 2004, pp. 375-380, IEEE, Newport Beach, CA, US.
Tschanz, et al., "Adaptive Body Bias for Reducing Impacts of Die-to-Die and Within-Die Parameter Variations on Microprocessor Frequency and Leakage", 2002 IEEE International Solid-State Circuits Conference, Feb. 2002, 4 pages (pp. 1-4 in pdf), vol. 1, IEEE, US.
Jenkins, et al.,"An On-Chip Jitter Measurement Circuit with Sub-picosecond Resolution", Proceedings of ESSCIRC, Jan. 2005, pp. 157-160, Grenoble, France.
Restle, et al., "Timing Uncertainty Measurements on the Power5 Microprocessor", IEEE 2004 Solid-State Circuits Conference, Jun. 2004, 8 pages (pp. 1-8 in pdf), IEEE, US.
Xia, et al., "Self-Refereed on-chip Jitter Measurement Circuit Using Vernier Oscillators", Proceedings of the IEEE Computer Society Annual Symposium on VLSI, May 2005, 6 pages (pp. 1-6 in pdf), IEEE, US.
Ong, et al. "A Scalable On-Chip Jitter Extraction Technique", Proceedings of the $22^{nd}$ IEEE VLSI Test Symposium, VTS 2004, Apr. 2004, pp. 1-6, IEEE, US.
Larsson, et al. "Measuring high-bandwidth signals in CMOS circuits", Electronics Letters, Sep. 30, 1993, pp. 1761-1762, vol. 29, No. 30, IET.
Ho, et al., "Applications of On-Chip Samplers for Test and Measurement. of Integrated Circuits", 1998 Symposium on VLSI Circuits, Jun. 1998, 2 pages (pp. 1-2 in pdf), IEEE, HI, US.
Takamiya, et al., "An On-chip 100GHz-Sampling Rate 8-channel Sampling Oscilloscope with Embedded Sampling Clock Generator", 2002 IEEE International Solid-State Circuits Conference, Feb. 2002, 3 pages (pp. 1-3 in pdf), CA, US.
Abaskharoun, et al., "Strategies for On-chip Sub-nanosecond Signal Capture and Timing Measurements", 2001 IEEE International Symposium on Circuits and Systems, ISCAS 2001, May 2001, pp. IV-174-IV177, vol. 4, IEEE, Sydney, NSW.
Ong, et al. "Jitter Spectral Extraction for Multi-gigahertz Signal", Asia and South Pacific Design Automation Conference, Jan. 2004, pp. 298-303, IEEE, US.
List of IBM Patents or Patent Applications Treated as Related, 2 pages.
U.S. Appl. No. 15/040,423, filed Feb. 10, 2015, Franch, et al.

\* cited by examiner

MEASUREMENT OF SIGNAL DELAYS IN MICROPROCESSOR INTEGRATED CIRCUITS WITH SUB-PICOSECOND ACCURACY USING FREQUENCY STEPPING

BACKGROUND OF THE INVENTION

1. Field of the Invention

The present invention is related to integrated circuits incorporating internal timing measurement circuits, and more specifically to techniques for measuring signal delays within an integrated circuit by frequency-stepping a clock signal.

2. Description of Related Art

Measurement of on-chip signal delay is performed routinely in microprocessors in order to determine whether timing windows are maintained and in some cases to measure temperature and power supply voltages indirectly. The limitations of such measurements are typically on the order of one delay stage (one inverter) delay in duration, which in present-day integrated circuits (ICs) is approximately 5 picoseconds (ps). In order to achieve measurement accuracies finer than this, off-chip measurements are generally necessary, but for measuring delays, the errors produced by the signal transit required to bring a signal-under-measurement off-chip typically negate any sort of accuracy improvement that can be had with any off-chip measurement. More accurate techniques s are available to measure delays within integrated circuits, but they typically require complex calibration and/or complex circuits.

Resonant clocking of digital integrated circuits provides low energy consumption and well-controlled clock characteristics, including reduction of jitter and predictable point-to-point delay. In some implementations, a reduced pulse width is employed in resonant clock drivers to further decrease energy consumption, since the clock drive only needs to be active long enough to restore the energy that is lost in the portions (sectors) of the resonant clock distribution network that is being driven by the individual clock drivers.

Mode changing in a resonant clock distribution network is needed for variable operating frequency, for example, in a processor integrated circuit with "turbo" operating modes or in which voltage-frequency scaling is employed to reduce energy consumption when processor activity is low. The mode changing may change operating frequency and/or may change the clock mode from resonant distribution to non-resonant. However, when changing the mode in a resonant clock distribution network, which generally change in the drive strength and/or pulse width of the clock driver circuits, the mode change may generate a short cycle or glitch that can cause improper operation of the integrated circuit in which the resonant clock distribution network is implemented. Changes in mode typically need to generate less than a 1% change in clock period/clock frequency in order to avoid timing margin violations that can result in functional errors. However, a 1% change at a clock frequency of 4 gHz is less than 2.5 ps, which would require at least 1 ps accuracy to measure with any certainty.

It would therefore be desirable to provide a measurement scheme that can be implemented within a microprocessor circuit to determine sub-ps delay values.

BRIEF SUMMARY OF THE INVENTION

The invention is embodied in a delay measurement system.

The system uses a delay line edge capture circuit that captures the output of inverters within a tapped delay line having latched outputs and a short delay length between adjacent taps. A reference clock synchronous with the signal being measured causes the latches to capture an edge of a signal delayed through the delay line. The system, which may be partially implemented by a processor and program instructions, controls the frequency of a clock from which the reference clock and the signal being measured are derived and captures edge positions from the latched tap outputs. A first measurement frequency is found for which the edge of the signal being measured lies at the boundary between two adjacent delay taps having values equally distributed in measurement data. Another such second measurement frequency is found for which another signal introduced to the delay has captured tap positions equally distributed between the same adjacent tap positions. The difference in period between the first and second measurement frequency yields the difference in delay between the two signals. The second signal may be the reference clock signal, so that the difference in delay is determined with respect to the reference clock. The measurement may be repeated or performed using a second tapped delay line for a third signal, and the relative delay may be computed between the periods of the two frequencies yielded by the two measurements to yield the delay between the first and third signals. Alternatively the difference in delay can be determined by measuring the delay with respect to the reference clock for each of the signals being measured.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention relates to delay measurement circuits, and in particular, a delay measurement circuit that can measure sub-picosecond delays. A tapped delay line is used to capture an edge position of a signal to be measured using a reference clock. The signal to be measured and the reference clock are synchronous, e.g., generated from the same global clock source. By changing the frequency of the reference clock, measurement frequencies are found for the captured edge positions are evenly distributed around the boundary between the same two adjacent taps for each of the signals being measured. The delay of the signal to be measured is then be determined from the difference between the periods of the measurement frequencies.

Figure 1:
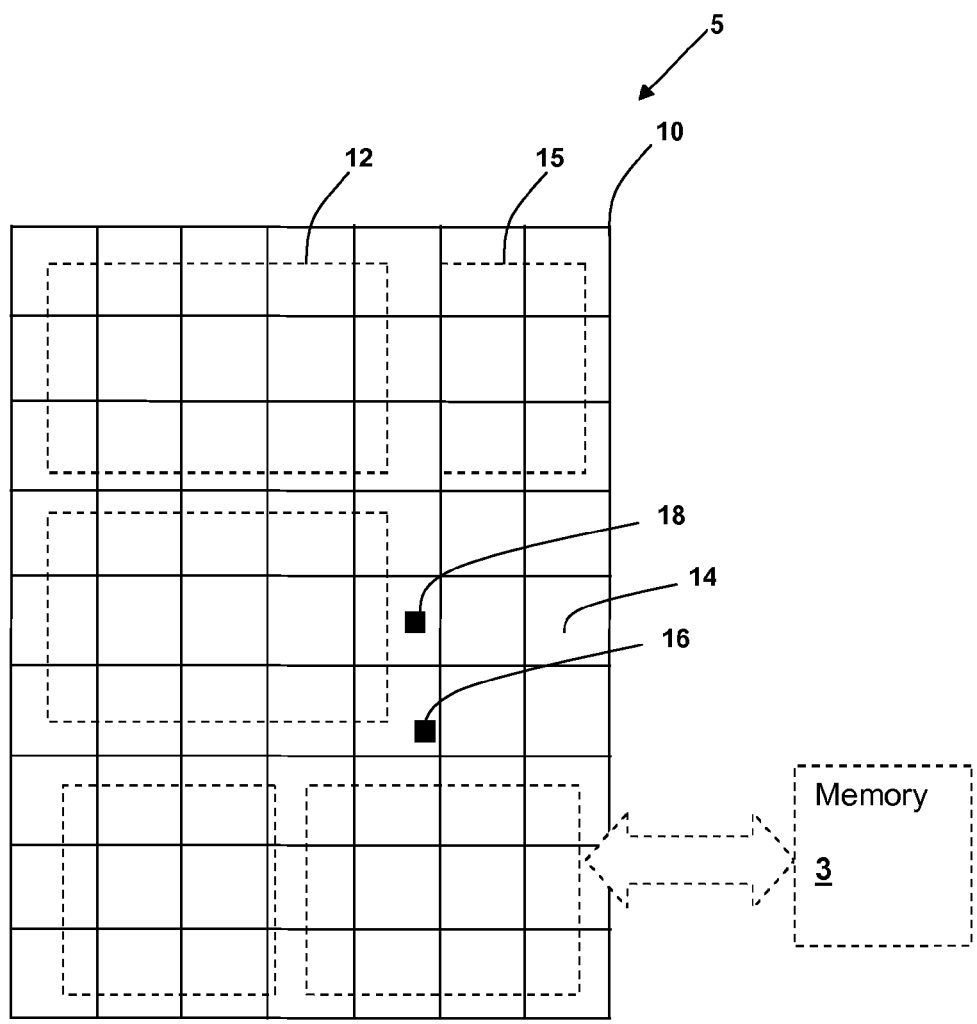
FIG. 1 is a block diagram illustrating an exemplary integrated circuit 5 having a resonant clock distribution grid 10.

With reference now to the figures, and in particular with reference to FIG. 1, an exemplary integrated circuit (IC) 5 is shown, which may represent a processor integrated circuit, a memory device, or another very-large scale integrated circuit (VLSI) that contains logic and storage. In one example, IC 5 represents a processor coupled to a memory 3 and performs computations and other operations as described herein, in order to perform boot-time, run-time or calibration-time measurements using techniques described herein that can set operational parameters or detect potential faults under the current operating conditions such as power supply voltage and temperature. Within IC 5, a clock grid 10 provides a resonant clock distribution network. IC 5 includes a plurality of functional circuits 12, such as computation units, memories, caches, etc. and includes a power management unit (PMU) 15 that controls the clock frequency and power supply voltages within IC 5. A delay measurement unit 16, such as that described herein and in U.S. Pat. Nos. 7,576,569 and 8,415,413, the disclosures of which are incorporated herein by reference, is included in IC 5 and provides data from which delay measurements are made as described below. Clock grid 10 is a metal layer grid that divides IC 5 into sectors 14, each of which includes drive circuit that locally drive clock grid 10 in accordance with a distributed global clock, generally provided by a phase-lock loop (PLL) within power PMU 15 that determines the operating frequency of IC 5. The PLL may be located separate from PMU 15, as well. Delay measurement unit 16 receives a separate reference clock that is synchronous with the global clock or other clock or pulse being measured by delay measurement unit 16. In some embodiments, the global clock (or another clock from which the global clock signal is derived) may be provided from an external source such as a wafer kerf pad or input pin, or generated from a different PLL, so that the frequency of the reference clock can be varied with more precision than that available from internal dividers/PLLs. For example, the reference clock may be a half frequency division of the global clock, while the signal to be measured is the resonant clock on clock grid 10, so that latency of the resonant clock with respect to the stimulus global clock signal can be determined for various modes and/or frequencies. Clock grid 10 is resonated at one of two or more selectable frequencies as selected by a switching circuit 18, to distribute the global clock with low energy consumption and stable phase. Clock grid 10 may also be operated in a non-resonant condition, generally at a lowered frequency. A mode selection logic within PMU 15 provides mode selection, and in the instant disclosure, mode control signals that are distributed to each of sector buffers 52 so that the resonant (or non-resonant) frequency and a pulse width for the clock drivers can be selected by sector, or by another subdivision of clock grid 10.

Figure 2:
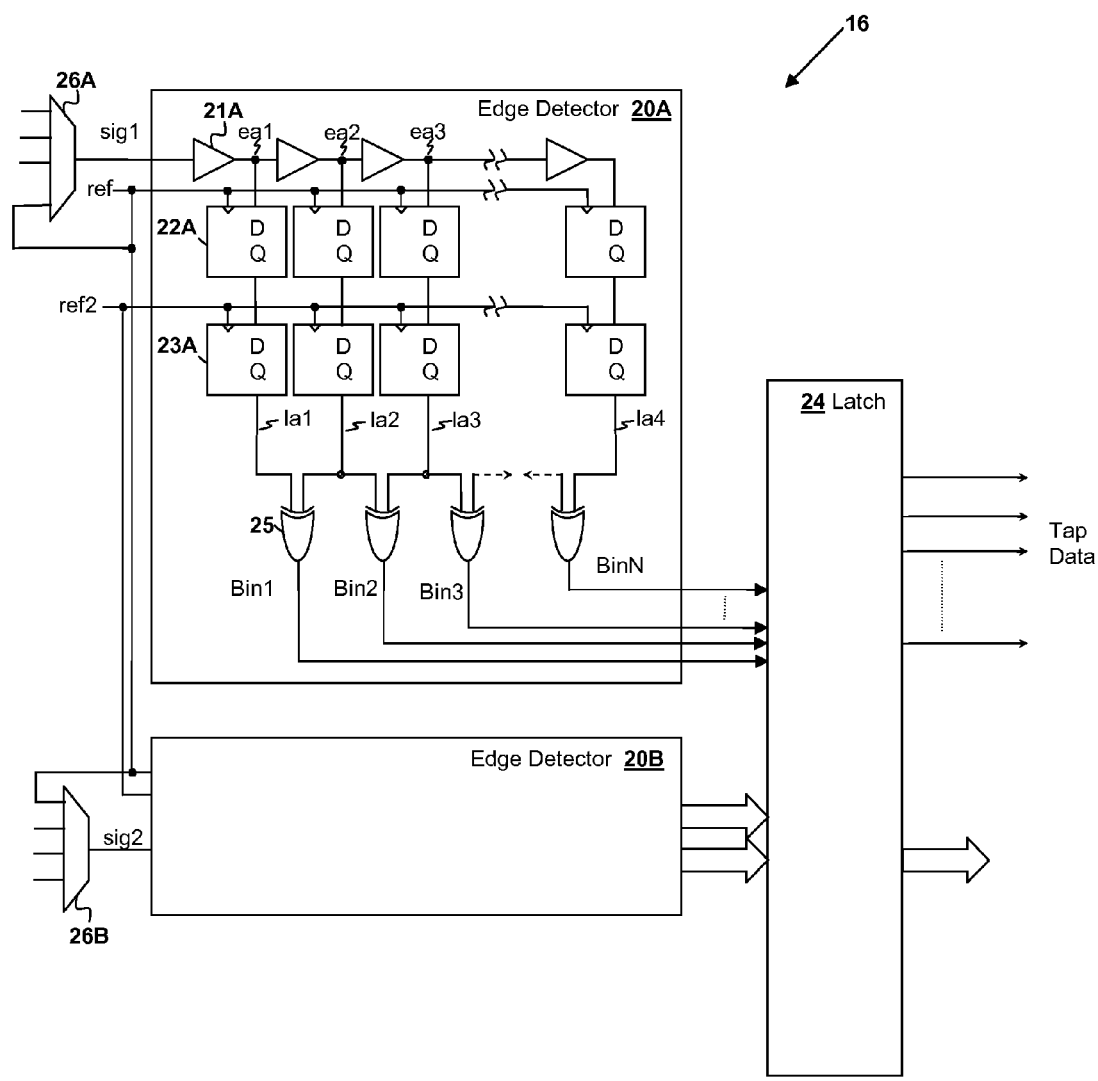
FIG. 2 is a simplified schematic diagram of an edge detector circuit 16 that may be implemented in integrated circuit 5 of FIG. 1.

Referring now to FIG. 2, details of an example delay measurement circuit 16 of FIG. 1 are shown. In the depicted example, a signal to be measured sig1 is selected from among multiple input signals provided to a multiplexer 26A is provided to a delay line formed by a cascade of buffers 21A, which provide inputs to a plurality of transparent latches 22A forming a latch bank. Signals ea1-ea3 are delayed versions of signal sig1 at the outputs of the first three of buffers 21A, which are progressively delayed by an additional buffer delay. When a reference clock signal ref falls, the values of signals ea1-ea3 are latched by latches 22A to generate latch output signals la1-laN. Latch output signals la1-laN are provided to inputs of logical exclusive-OR gates 25 that provide data having logical "1" values only for pairs of cells that have different logical states, revealing the "position" of the edge of signal to be measured sig1 within the delay line formed by buffers 21A via output signals Bin1-BinN. While the illustrated circuit uses buffers for simplicity, since the shortest circuit delays are available with inverter stages, inverters will preferably be used, requiring substitution of further logic such as exclusive-NOR gates instead of exclusive-OR gates 25. The bin data provided output signals Bin1-BinN is latched by a latch 24 that provides an interface, either via scan chain or programmatic access, via which the captured edge position data can be read by the methods and systems described herein. In alternative embodiments, the output of latches 23A could be accumulated or read directly. A second edge detector 20B can be provided for simultaneous capture of the edge positions of another signal to be measured sig2, selected from among multiple inputs provided to a multiplexer 26B, so that delay between edges of signals to be measured sig1 and sig2 can be determined directly from the simultaneously-captured data. Alternatively, the delay between signals to be measured is determined by selecting those signals as sig1 via multiplexer 26A and the delay is determined from data captured by sequential measurements. Multiplexers 26A and 26B also can select reference clock ref as their input, permitting the system to measure an edge position of a signal to be measured selected as signal sig1, then selecting reference clock ref as signal sig1 to determine the delay of the signal to be measured from the two measurements.

Figure 3A:
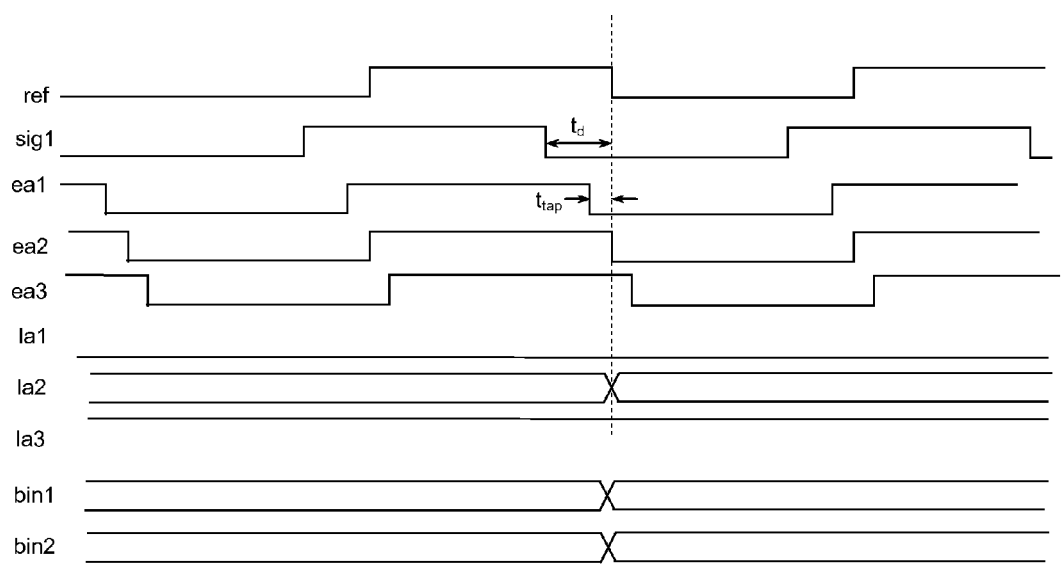
FIGS. 3A and 3B are timing diagrams illustrating a delay measurement using the circuit of FIG. 2.

Referring additionally to FIG. 3A, a timing diagram showing signals within delay measurement circuit 16 of FIG. 2 is shown. When the falling edge of signal to be measured sig1 propagates through the chain of buffers 21A, the falling edge sequentially arrives as output signals ea1-ea3. The falling edge of reference clock ref1 captures the edge of signal to be measured sig1 at each of latches 22A. In the example, the frequency of the clock from which reference clock ref1 and signal to be measured sig1 are generated has been adjusted so that the falling edge of signal to be measured sig1 is distributed evenly at the input of the one of latches 22A from which latch output signal la2 is generated, so that latch output signal la2 assumes an output value of "0" for 50% of occurrences of the falling edge of reference clock ref1 and an output value of "1" the other 50% of occurrences. The inputs of latches 22A form the timing boundary between the taps, since the values at the inputs of latches 22A are the values captured by the falling edge of reference clock ref. Since latch output signal la2 affects both output signal Bin1 and output signal Bin2, as seen in FIG. 3A, the values of output signal Bin1 and output signal Bin2 are also distributed evenly with an output value of "0" for 50% of occurrences of the falling edge of reference clock ref1 and an output value of "1" the other 50% of occurrences. In the example, the falling edge of signal to be measured sig1 has propagated through the latch 22A that generates output signal ea1 and has not propagated through the latch that generates output signal ea3, and thus latch output signals la1 and la3 are static, with output values of "0" and "1", respectively. However, if a large amount of jitter is present in the signal to be measured or the reference clock, or the time delay between taps is very short, the values of latch output signals la1 and la3 might not be static, but the technique described above may still be used. For example, the value of latch output signal la1 might have a 10% probability of assuming the logical "1" state, the value of latch output signal la3 might have a 10% probability of assuming the logical "0" state, and as long as the value of latch output signal la2 is evenly distributed between the logical "0" state and the logical "1" state, the measurement and computation described above still apply.

Figure 3B:
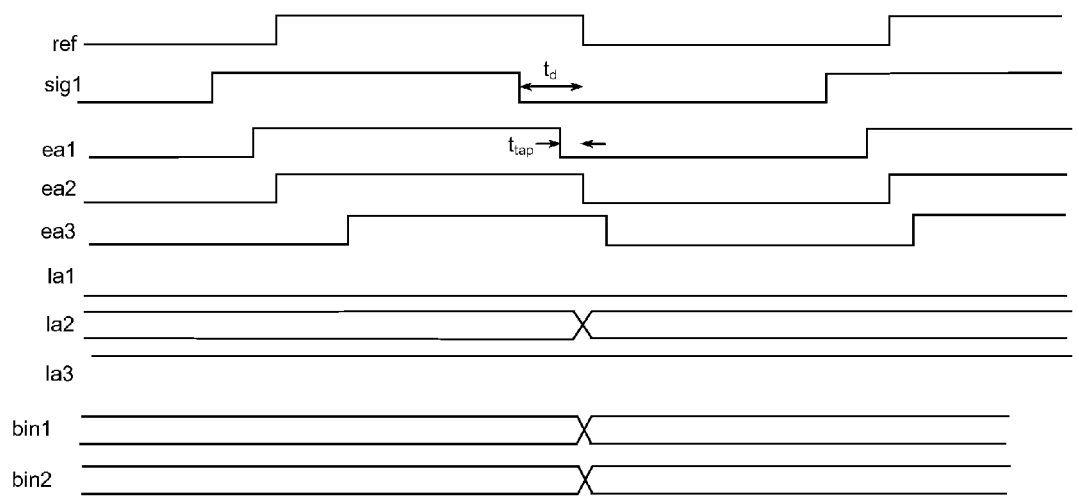

As the frequency reference clock signal ref1 is varied, the tap position of the falling edge of signal to be measured sig1 will change, since the delay between taps $t_{tap}$ is independent of the frequency of reference clock signal ref1. When a frequency is found that has even distribution of edge captures straddling the boundary between two taps, such as illustrated in FIG. 3A by equal distribution of the values of tap output signal eat for the determined frequency, the delay $t_d$ of the falling edge of signal to be measured sig1 can be determined from the difference between the period of the determined frequency and the period of another frequency determined for a different signal, that can be a second measurement signal or reference clock ref as selected by multiplexer 26A. The other frequency that is determined is a frequency at which the edge position of the other signal is evenly distributed across the boundary between the same two adjacent taps as were determined for the first determined frequency. FIG. 3B illustrates such a measurement with a different input signal selected for measurement by multiplexer 26A. The absolute delay of the second signal selected as signal under measurement sig1 is shorter than the delay of the first signal, so the frequency at which the 50% distribution condition at the boundary between the same adjacent tap locations is met is lower for the second selected signal. As mentioned above, as an alternative, the second delay measurement may be performed using a second edge detector 20B, or the measurements may be performed sequentially using edge detector 20A. When two frequencies are determined, either for a signal under measurement and reference clock ref or for two signals under measurement, the delay between the two edges is determined as $1/f_1-1/f_2$, where $f_1$ is the first determined frequency and $f_2$ is the second determined frequency. If the second frequency is determined for reference clock ref selected as the input, then the delay between two other signals under measurement can be determined as delay=$(1/f_1-1/f_r)-(1/f_2-1/f_r)$ where $f_r$ is the determined frequency for reference clock ref. While it is not necessary to determine $f_r$ if only the relative delay between the first signal under measurement and the second signal under measurement is needed, since delay=$(1/f_1-1/f_r)-(1/f_2-1/f_r)=1/f_1-1/f_2$, if using simultaneous measurement with two edge detectors, it would be desirable to perform four measurements (one signal and one reference clock measurement for each delay line) to eliminate error due to any differences between the delay lines within edge detectors 20A, 20B. Since the measurement is independent of the actual delay of the delay line, and the accuracy to which the position of the edge at the boundary between the adjacent taps is determined by the number of samples, the resulting accuracy of the measurement is much finer than the typical delay line measurement in which the error is equal to the tap size, providing at least a 10 or 20-fold improvement in delay measurement accuracy. The techniques described herein are especially suited for measuring short delay differences with high accuracy, since the edge of the signals under measurement are placed between the same two adjacent taps by varying the frequency. The accuracy of the measurement is generally determined by the uncertainty of the frequency, or the coarseness of the frequency adjustment.

For each of the measurements described above, the pattern of data produced by output signals Bin1-BinN will be strings resembling the data in Table I below, in which the edge position will generally only toggle between two adjacent taps and the average tap location will be computed as $Tap_{avg}=(Tap1*N_{tap1}+Tap2*N_{tap2})/(N_{tap1}+N_{tap2})$, where $N_{tap1}$ and $N_{tap2}$ are the number of samples having the edge at adjacent tap1 and tap2, respectively, and where Tap1 and Tap2 are the respective tap adjacent positions, i.e., the number of tap delays that the signal to be measured has been delayed through the delay line.

TABLE I 0000000001000000000
0000000001000000000
0000000000100000000
0000000000100000000
0000000001000000000
0000000001000000000
0000000001000000000
0000000000100000000

The above data can be collected for a number of frequencies and then analyzed, or the frequency may be adjusted until the equal distribution condition is met for two adjacent taps. The frequency of the reference clock controls the length of time the pulse is propagated through the delay line before the edge is captured and so the position of the edge can be varied among the taps, until a frequency is found for which the distributions of the tap are balanced at the boundary between two adjacent tap positions, i.e., the samples are evenly distributed between two adjacent bins corresponding to output signals Bin1-BinN. Since the pulse and the reference clock are synchronous, delaying the reference clock by reducing the frequency also delays the pulse edge being measured, which results in no measurement error due to the stepped frequency, only a change in the distribution of the data values with respect to the bins. In some embodiments, only two latches may be used, and a frequency found for each signal being measured for which the distribution of edge positions is equal among the two adjacent bins. However, using longer delay lines with a larger number of taps gives flexibility in measuring a wider range of signal delay.

Figure 4:
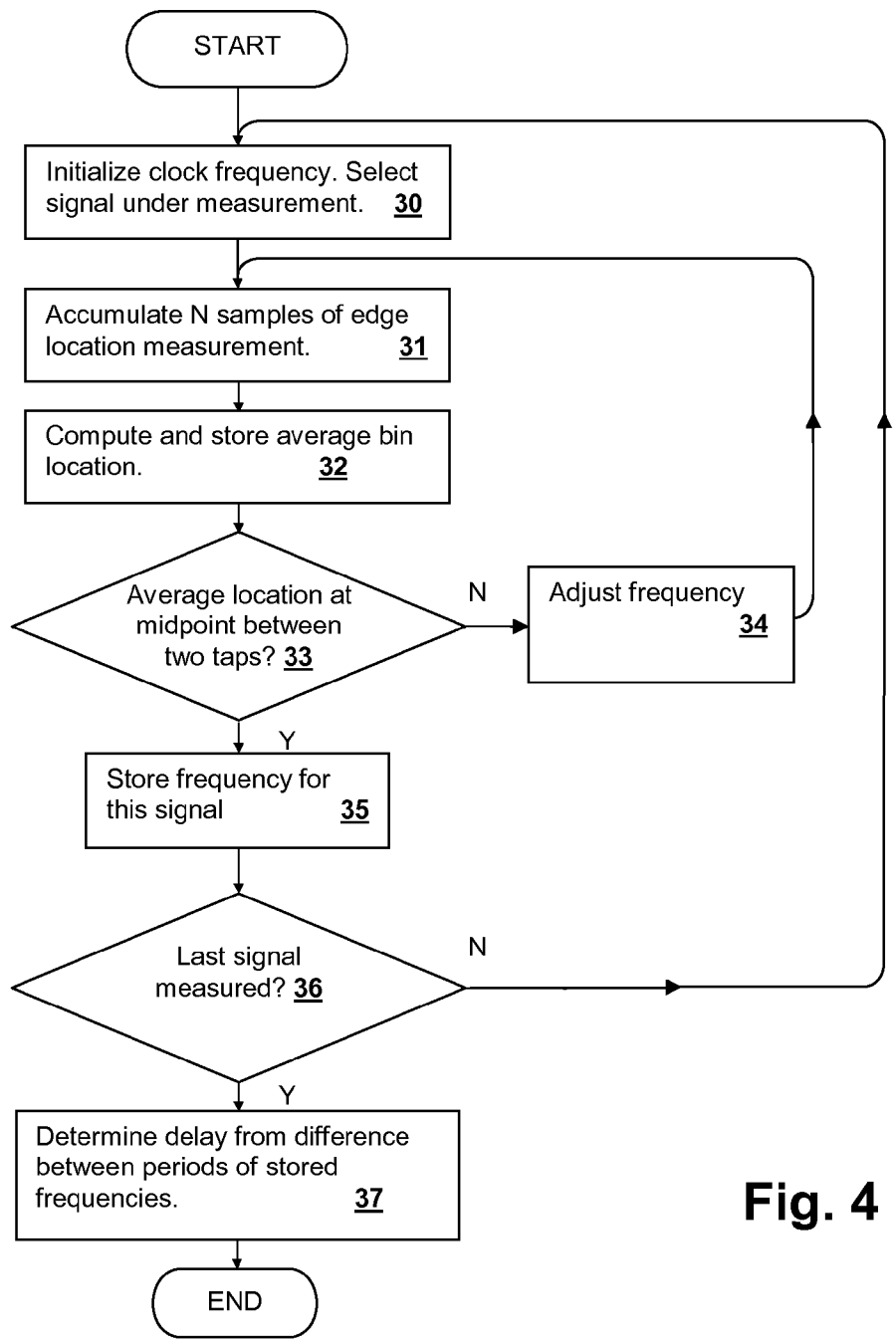
FIG. 4 is flow chart illustrating a method that may be used to determine the delay of a pulse edge within integrated circuit 5.

Referring now to FIG. 4, an example of a method of measuring a delay is shown. First the master reference clock that determines the reference clock frequency is set and the signal under measurement is selected (step 30) and a number N of samples of edge location measurements are obtained from delay measurement circuit 16 (step 31). The average edge location is computed and stored (step 32). Until a frequency is reached at which the distribution of samples is evenly distributed between two adjacent bins (decision 33), the frequency is adjusted (step 34) and steps 32-33 are repeated. The frequency adjustment can be made by changing internal dividers/multipliers that generate the reference clock. Alternatively, if the master reference clock is provided from an external source, then the frequency can be increased/decreased at the external source. Once a frequency has been determined for which the edge location is balanced between the two adjacent bins reached (decision 33), the determined frequency is stored for the selected signal (step 35) and until the last signal has been measured (decision 36) then the process is repeated from step 30 in which a next signal is selected and the reference frequency is re-initialized. Once the last signal has been measured (decision 36), the delay is determined from the periods of the stored frequencies as noted above (step 37). As mentioned above, since the delay measurements needed are typically relative, either the measurement is be repeated for a second signal with respect to which the delay is being measured, or two tapped delay lines can simultaneously capture data, as shown in FIG. 2.

Figure 5:
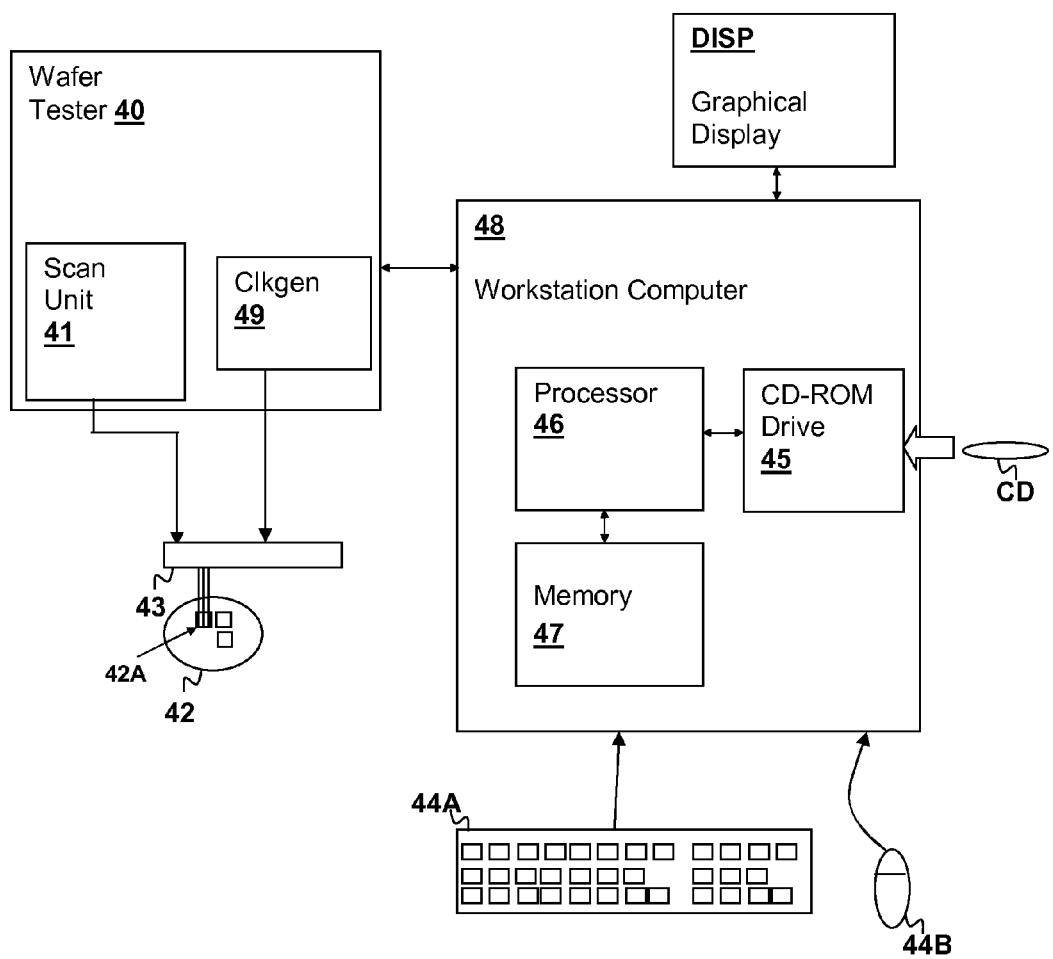
FIG. 5 is a block diagram of a test system that can be used to implement the method of FIG. 4.

Referring now to FIG. 5, a test measurement system in accordance with an embodiment of the present invention is shown. A workstation computer 48 includes a processor 46 for executing program instructions forming a computer program, which may be stored on a media such as compact disc CD and loaded into memory 47 by processor 48 from a CD-ROM drive 45. A graphical display 49 is provided for displaying user interfaces for controlling measurements made by the test system of FIG. 5 and for displaying results of the measurements in tabular and/or graphical form. Input devices such as a keyboard 44A and a mouse 44B are included for controlling workstation computer system 48. Workstation computer system 48 is coupled to a wafer tester 40 having a test head 43 that is coupled by probes to a die 42A on a wafer 42. However, the present invention may also be practiced using packaged dies that include a test interface or other interface for controlling the test procedure and retrieving the test data. A programmable clock generator 49 is included to provide an external master frequency reference from which the reference clock is derived. A scan unit 41 can be used to start and control measurements, and to retrieve collected data when local measurement data storage is supplied on die 42A. As mentioned above, the system of FIG. 5 is only exemplary, and the techniques disclosed herein may be used not only in testing and evaluation of wafer-level designs, but alternatively may be performed within a processor integrated circuit during run time, during boot-time or during a special test or calibration interval. Other combinations of hardware and software may be used to provide for delay measurements during operation under various conditions, or during validation of a design. The following example provides an application of the delay measurement techniques to a resonant clocking design such as that illustrated in FIG. 1.

Figure 6:
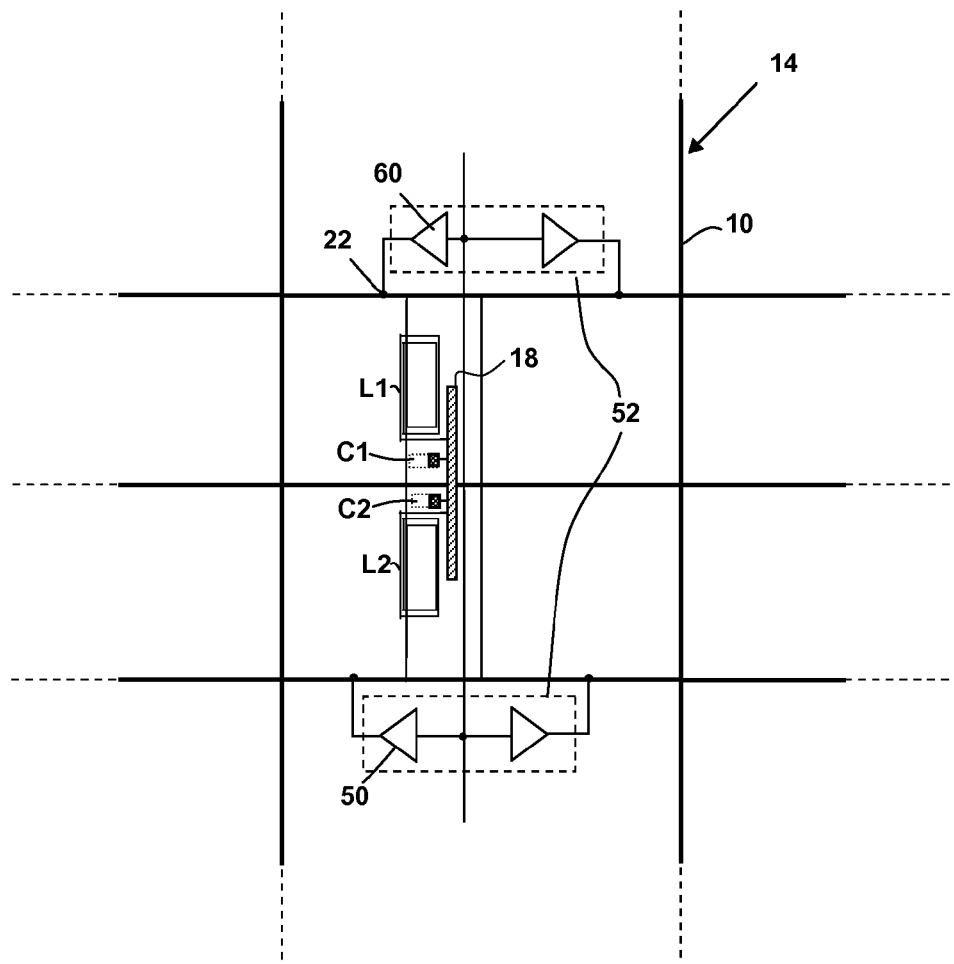
FIG. 6 is a simplified schematic diagram of a sector clock driver circuit 50 that may be used in resonant clock distribution grid 10 of FIG. 1.

Referring now to FIG. 6, details of example sector buffer 52 of FIG. 1 are shown. The depicted sector buffer 52 includes four clock drivers 60 that are connected to different drive points 22 of clock grid 10. In practice, each of clock drivers 60 will generally include a number of parallel drivers in order to reduce the output impedance of the final stage and that can be disabled or enabled to change the drive strength of the individual clock drivers 60 as shown in further detail below. Sector buffer 52 also includes inductors L1 and L2 and capacitors C1 and C2, which are selectively connected to clock grid 10 by a switching circuit 18 in order to change the resonant frequency of sector buffer 52, or to select non-resonant mode. By selecting the resonant frequency at each sector buffer 52 in IC 5, the frequency at which grid 5 resonates is changed. Sector buffer 52 is provided as an example of one type of sector buffer that supports multiple resonant frequencies and a non-resonant mode. However, the techniques disclosed herein apply to other types of sector buffers that use a single inductor with multiple tuning capacitors and other switching arrangements that provide for selection between modes. In one example, the delay measurements provided above are used to measure the delay between the clock signal on grid 5 and global clock signal clk for different operating frequencies or modes, so that changes in latency due to mode switching can be measured and confirmed with respect to specified limits. Such latency measurements can be used to determine the rate at which mode changes are propagated through the various sector buffers 52 as described in co-pending U.S. patent application Ser. No. 14/820,726 filed on Aug. 7, 2015, having at least one common inventor and entitled "SEQUENCED PULSE-WIDTH ADJUSTMENT IN A RESONANT CLOCKING CIRCUIT", the disclosure of which is incorporated herein by reference.

Figure 7:
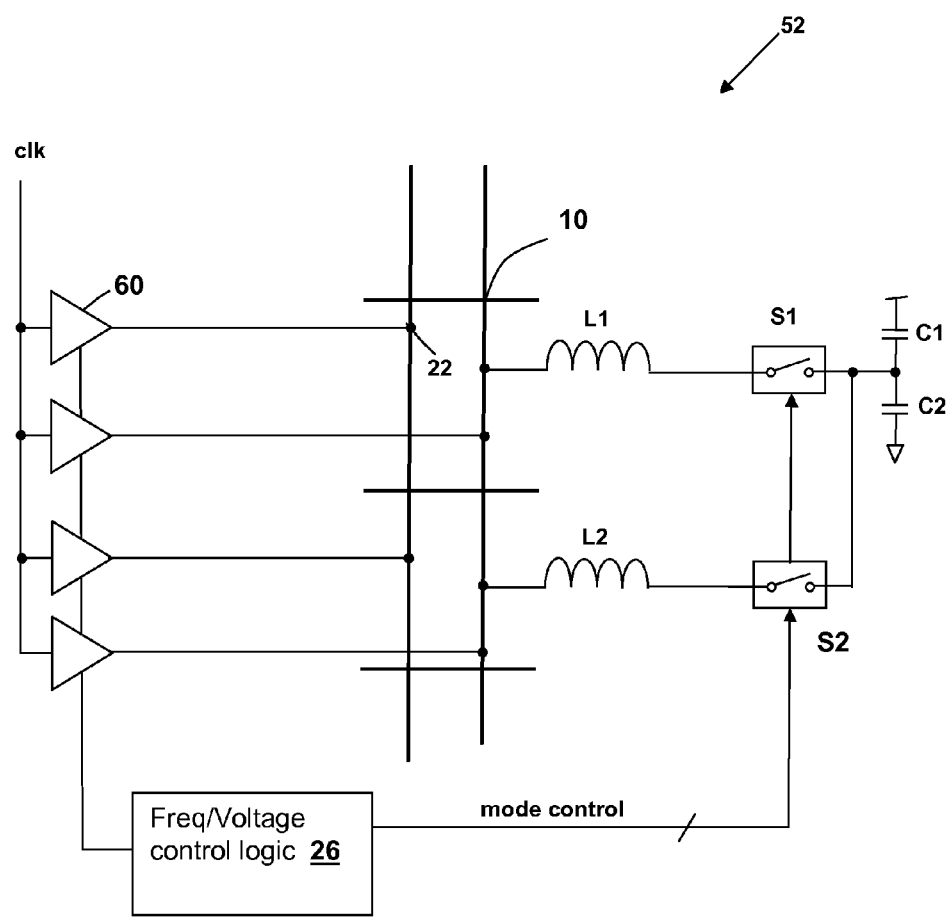
FIG. 7 is a schematic diagram of sector clock driver circuit 50 of FIG. 2.

Referring now to FIG. 7, further details of sector buffer 52 are shown. Switching circuit 18 includes switches S1 and S2, which are opened and closed to select different operating modes according to one or more mode control signals mode control provided from a frequency/voltage control logic 26 within PMU 15 of FIG. 1. If both switch S1 and S2 are open, then the resonant tank formed by one or both of inductors L1 and L2 and the parallel combination of capacitors C1 and C2 is broken and sector buffer 52 (and thus clock grid 10) will operate in non-resonant mode, and clock drivers 60 will drive a global clock waveform clk onto clock grid 10. If either or both of switches S1 and S2 are open, then the resonant tank formed by one or both of inductors L1 and L2 and the parallel combination of capacitors C1 and C2 is formed and sector buffer 20 (and thus clock grid 10) will operate in resonant mode. As long as global clock waveform clk has the appropriate frequency, i.e. within the resonant band of the tank formed by selected ones of inductors L1 and L2 and the parallel combination of capacitors C1 and C2, then clock drivers 60 will stimulate grid 10 to resonate at the frequency of global clock clk. In the instant disclosure, the pulse width of clock drivers 60 is also selected by mode control signals mode control to reduce energy consumption by clock drivers 60, so that only the required energy is transferred to grid 10. In non-resonant mode, the pulse width of clock drivers 60 is generally not reduced. Mode control signals mode control are made dynamically by frequency/voltage control logic 26 and the instant disclosure provides circuits and techniques by which changes in latency at the outputs of clock drivers 60 are reduced when changing clocking modes, i.e., when selecting between different operating frequencies and/or selecting between resonant and non-resonant operating modes. The delay between reduced pulse-width edges for different operating modes or different frequencies/operating conditions may be measured using the above-described delay measurement techniques to ensure that the latency changes due to pulse-width steps are not exceeding requirements.

Figure 8:
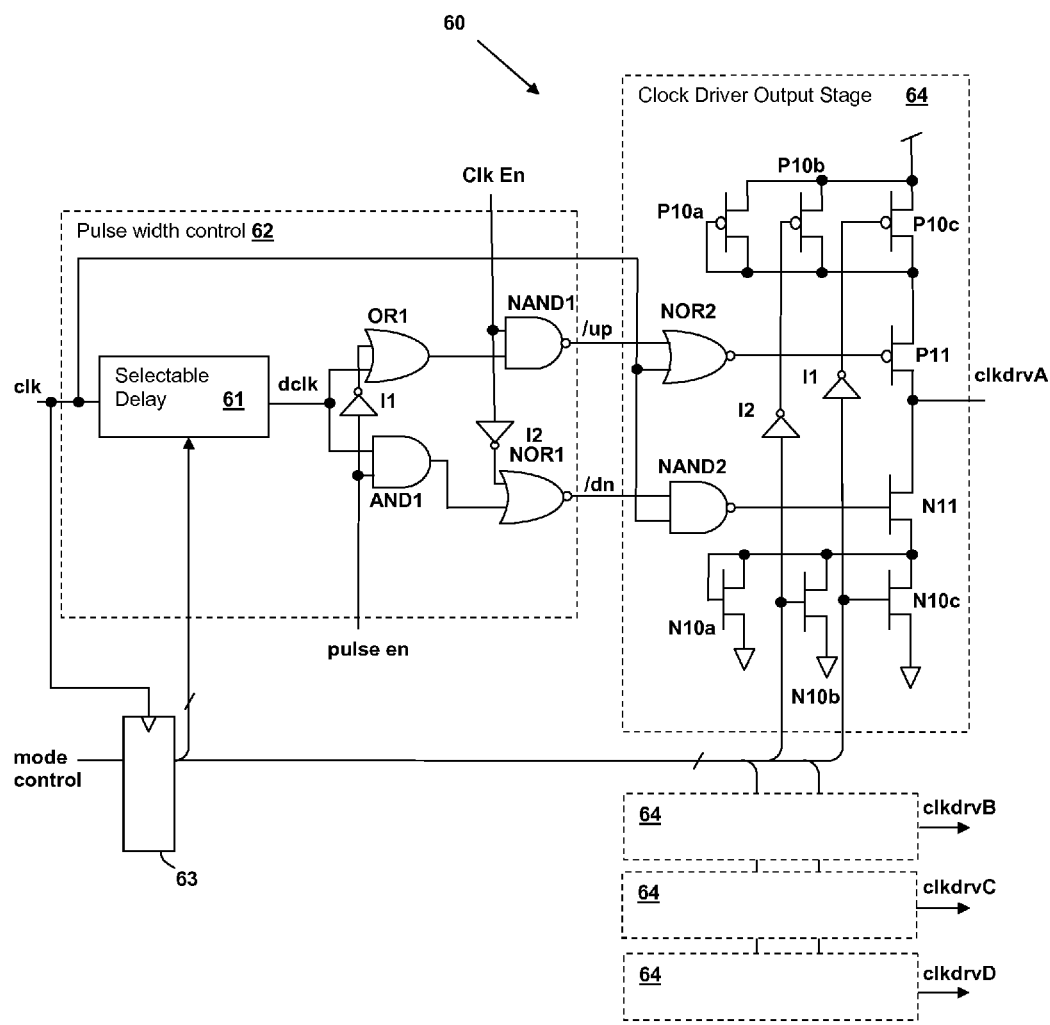
FIG. 8 is a schematic diagram of a clock buffer circuit 60 including a pulse width control circuit 62 according to a first example that may be used in the integrated circuit of FIG. 1.

Referring now to FIG. 8, details of a clock driver 60 according to a first example are shown. A clock driver output stage 64 includes a driver formed by transistors P11 and N11, which are generally of greater area than other transistors used to implement logic, or as mentioned above, a number of inverters may be connected in parallel to increase the drive strength of an output clkdrvA of clock driver 60.

In the instant example, the drive strength of clock driver 60 is controlled by controlling the current or impedance between the power supply voltage rails and the drain terminals of transistors P11 and N11, but alternatively, separate buffers can be individually enabled or disabled and connected in parallel at the output of clock driver 60. The inverter formed by transistors P11 and N11 has power supply rails supplied to the drain terminals of transistors P11 and N11 from a pair of transistors N10a and P10a configured to provide a lower current level through transistors P11 and N11, and another two pairs of transistors N10b, P10b and N10c, P10c configured to provide selectable higher current levels in combination with transistors N10a and P10a, when different combinations of mode control signals mode control are asserted. A per-sector latch 63 is used to ensure that mode control signals mode control change for each sector at the designated time. Alternatively, latches can be provided for larger groups of sectors, or for individual clock buffers within a sector. In another alternative embodiment, the timing of the changes to mode control signals mode control for individual sectors and/or drivers can be controlled by wire lengths, buffer insertions or other asynchronous delay methods that ensure that mode control signals mode control change at controlled times according to the design scheme. Inverters I1 and I2 provide complementary control signals for controlling the gate terminals of transistors P10c and P10b, respectively. The resulting operation provides a lower drive strength from clock driver output stage 64 when corresponding ones of mode control signals mode control are de-asserted. Four different current levels are possible with the illustrated clock driver output stage 64, but in practice, any number of power supply rail current or impedance control devices can be used to provide more discrete control of drive strength.

The other three clock driver output stages 64 are identical to the illustrated clock drive output stage 64 and provide outputs clkdrvB, clkdrvC and clkdrvD for driving the other three drive points 22, as shown in FIG. 3. Clock driver output stage 64 also includes logic formed by a logical-NOR gate NOR2, an inverter I1, a logical-NAND gate NAND2 and an inverter I2, which receive global clock signal clk and control the pull-up and pull-down portions of the driver, i.e., transistors P11 and N11, respectively. A pulse width control circuit 62 provides pull-up and pull-down enable signals which, in turn, provide a pulse up, do for each state of global clock signal clk that controls the duration of the pull-up and pull-down phase of outputs clkdrvA, clkdrvB, clkdrvC and clkdrvD. Illustrated pulse width control circuit 62 is a generalized example of a pulse width control circuit 62 that may be used to control clock drive output stages 64 so that glitches are not produced at the outputs clkdrvA, clkdrvB, clkdrvC and clkdrvD of control clock drive output stage 64. Details of various pulse width control circuits 62 that provide glitch-free operation are disclosed in U.S. patent application Ser. No. 14/814,780 filed on Jul. 31, 2015, by the same Applicant, and entitled "PULSE-DRIVE RESONANT CLOCK WITH ON-THE-FLY MODE CHANGE", the disclosure of which is incorporated herein by reference.

Pulse width control circuit 62 includes a selectable delay 61 that delays global clock signal clk to produce a delayed clock dclk and which is controlled according to mode control signals mode control so that the delay time of the selectable delay 61 is selected for the current operating mode. Particular sectors may have a delayed selection of the operating mode, or may have a different mode selected by mode control signals mode control for the particular sector, depending on drive strength needs, pulse width needs, and whether a change has just occurred in the operating mode. The output of selectable delay 61 is gated by a logic circuit composed of a logical-OR gate OR1, a logical-AND gate AND1, with an inverter I1 illustrated to provide a complement to a control signal Pulse En that enables pulse width control of clock drive output stage 64, so that, for example, pulse width control can be disabled when non-resonant clocking mode is selected. Another logic circuit is provided to enable and disable clocking entirely and is composed of logical-NAND gate NAND1, logical-NOR gate NOR1 with an inverter I2 illustrated to provide a complement to a control signal Clk En that enables clocking of clock drive output stage 64. As mentioned above, characteristics of the resonant clocking circuit, including the delay of selectable delay may be measured using the above-described techniques in order to best determine how to transition between frequencies or modes of operation in the resonant clocking scheme disclosed above.

Figure 9:
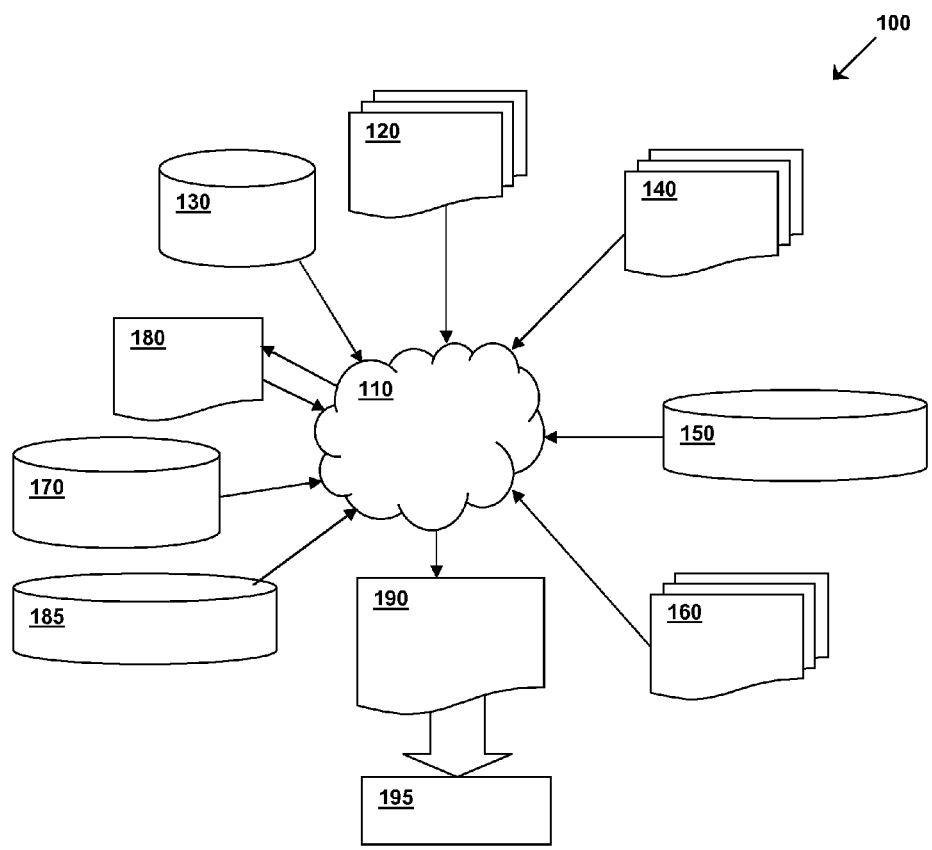
FIG. 9 is a flow diagram of a design process that can be used to fabricate, manufacture and test the integrated circuit of FIG. 1.

FIG. 9 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1, 2 and 6-8. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera Inc. or Xilinx, Inc.

FIG. 9 illustrates multiple such design structures including an input design structure 120 that is preferably processed by a design process 110. Input design structure 120 may be a logical simulation design structure generated and processed by design process 110 to produce a logically equivalent functional representation of a hardware device. Input design structure 120 may also or alternatively comprise data and/or program instructions that when processed by design process 110, generate a functional representation of the physical structure of a hardware device. Whether representing functional and/or structural design features, input design structure 120 may be generated using electronic computer-aided design (ECAD) such as implemented by a core developer/designer. When encoded on a machine-readable data transmission, gate array, or storage medium, input design structure 120 may be accessed and processed by one or more hardware and/or software modules within design process 110 to simulate or otherwise functionally represent an electronic component, circuit, electronic or logic module, apparatus, device, or system such as those shown in FIGS. 1, 2 and 6-8. As such, input design structure 120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 110 preferably employs and incorporates hardware and/or software modules for synthesizing, translating, or otherwise processing a design/simulation functional equivalent of the components, circuits, devices, or logic structures shown in FIGS. 1, 2 and 6-8 to generate a Netlist 180 which may contain design structures such as input design structure 120. Netlist 180 may comprise, for example, compiled or otherwise processed data structures representing a list of wires, discrete components, logic gates, control circuits, devices, models, etc. that describes the connections to other elements and circuits in an integrated circuit design. Netlist 180 may be synthesized using an iterative process in which netlist 180 is resynthesized one or more times depending on design specifications and parameters for the device. As with other design structure types described herein, netlist 180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 110 may include hardware and software modules for processing a variety of input data structure types including Netlist 180. Such data structure types may reside, for example, within library elements 130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 140, characterization data 150, verification data 160, design rules 170, and test data files 185 which may include input test patterns, output test results, and other testing information. Design process 110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 110 without deviating from the scope and spirit of the invention. Design process 110 may also include modules for performing standard circuit design processes such as timing analysis, verification, design rule checking, place and route operations, etc.

Design process 110 employs and incorporates logic and physical design tools such as HDL compilers and simulation model build tools to process input design structure 120 together with some or all of the depicted supporting data structures along with any additional mechanical design or data (if applicable), to generate a second design structure 190. Design structure 190 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to input design structure 120, design structure 190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2 and 6-8. In one embodiment, design structure 190 may comprise a compiled, executable HDL simulation model that functionally simulates the devices shown in FIGS. 1, 2 and 6-8.

Design structure 190 may also employ a data format used for the exchange of layout data of integrated circuits and/or symbolic data format (e.g. information stored in a GDSII (GDS2), GL1, OASIS, map files, or any other suitable format for storing such design data structures). Design structure 190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2 and 6-8. Design structure 190 may then proceed to a stage 195 where, for example, design structure 190: proceeds to tape-out, is released to manufacturing, is released to a mask house, is sent to another design house, is sent back to the customer, etc.

As noted above, portions of the present invention may be embodied in a computer program product, which may include firmware, an image in system memory or another memory/cache, or stored on a fixed or re-writable media such as an optical disc having computer-readable code stored thereon. Any combination of one or more computer readable medium(s) may store a program in accordance with an embodiment of the invention. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of the present application, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A system for measuring a delay of an edge of a first signal with respect to an edge of a second signal, comprising:
   an integrated circuit having a tapped delay circuit, wherein the edge of the first signal to be measured and the edge of the second signal to be measured are propagated through the tapped delay circuit and first tap positions of the edge of the first signal to be measured and second tap positions of the edge of the second signal to be measured are captured;
   a test system that repeatedly sets a frequency of a clock signal of the integrated circuit from which the first signal and the second signal are synchronously derived to a plurality of measurement frequencies, wherein the test system reads an interface of the integrated circuit to read data from the integrated circuit corresponding to the first tap positions and the second tap positions, wherein the test system sets the frequency of the clock signal to a first frequency at which an average of the first tap positions lies at a boundary between a pair of adjacent tap positions and a second frequency at which an average of the second tap positions lies at the boundary between the pair of adjacent tap positions, and computes the delay from a difference between a period of the first frequency and a period of the second frequency.

2. The system of claim 1, wherein the first signal is a signal to be measured and the second signal is a reference clock provided to the tapped delay circuit to trigger the capture of the first tap positions.

3. The system of claim 2, wherein the tapped delay circuit further captures third tap positions of an edge of a third signal to be measured that is propagated through the tapped delay line, and wherein the test system further reads an interface of the integrated circuit to read data from the integrated circuit corresponding to the third tap positions, wherein the test system sets the frequency of the clock signal to a third frequency at which an average of the third tap positions lies at the boundary between the pair of adjacent tap positions and computes the a delay of the third signal from a difference between a period of the third frequency and a period of the second frequency.

4. The system of claim 3, wherein the tapped delay circuit comprises two tapped delays that capture the first and third tap positions simultaneously using corresponding ones of the two tapped delays.

5. The system of claim 1, wherein the clock signal of the integrated circuit is derived from an externally supplied clock, and wherein the test system sets a frequency of the externally supplied clock.

6. The system of claim 1, wherein the test system sets a frequency multiplier or divider within the integrated circuit that determines the frequency of the clock signal.

7. The system of claim 1, wherein the integrated circuit has a clock distribution network that operates in both non-resonant and resonant modes, wherein the first signal is a first clock generated in a non-resonant clocking mode of the integrated circuit, wherein the second signal to be measured is a second clock generated in a resonant clocking mode of the integrated circuit, and wherein the test system determines a latency of the first clock with respect to the second clock.

8. A system for measuring, comprising:
   an integrated circuit having a tapped delay circuit, wherein the edge of the first signal to be measured and the edge of the second signal to be measured are propagated through the tapped delay circuit and first tap positions of the edge of the first signal to be measured and second tap positions of the edge of the second signal to be measured are captured at an edge of a reference clock signal;
   a clock generator for generating an external clock supplied to the integrated circuit, wherein the reference clock signal is generated from an internal clock derived from the external clock; and
   a test system that repeatedly sets a frequency of a clock signal of the integrated circuit from which the first signal and the second signal are synchronously derived to a plurality of measurement frequencies, wherein the test system reads an interface of the integrated circuit to read data from the integrated circuit corresponding to the first tap positions and the second tap positions, wherein the test system sets the frequency of the clock signal to a first frequency at which an average of the first tap positions lies at a boundary between a pair of adjacent tap positions and a second frequency at which an average of the second tap positions lies at the boundary between the pair of adjacent tap positions, and computes the delay from a difference between a period of the first frequency and a period of the second frequency.

9. The system of claim 8, wherein the first signal is a signal to be measured and the second signal is the reference clock signal.

10. The system of claim 9, wherein the tapped delay circuit further captures third tap positions of an edge of a third signal to be measured that is propagated through the tapped delay line, and wherein the test system further reads an interface of the integrated circuit to read data from the integrated circuit corresponding to the third tap positions, wherein the test system sets the frequency of the clock signal to a third frequency at which an average of the third tap positions lies at the boundary between the pair of adjacent tap positions and computes the a delay of the third signal from a difference between a period of the third frequency and a period of the second frequency.

11. The system of claim 9, wherein the tapped delay circuit comprises two tapped delays that capture the first and third tap positions simultaneously using corresponding ones of the two tapped delays.

12. The system of claim 8, wherein the test system further sets a frequency multiplier or divider within the integrated circuit that further determines the frequency of the reference clock signal.

13. The system of claim 8, wherein the integrated circuit has a clock distribution network that operates in both non-resonant and resonant modes, wherein the first signal is a first clock generated in a non-resonant clocking mode of the integrated circuit, wherein the second signal to be measured is a second clock generated in a resonant clocking mode of the integrated circuit, and wherein the test system determines a latency of the first clock with respect to the second clock.

* * * * *